(12) United States Patent
Senghor et al.

(10) Patent No.: US 9,972,801 B2
(45) Date of Patent: May 15, 2018

(54) FORMING OF OPTOELECTRONIC DEVICES, PARTICULARLY OF INVERTED-TYPE OPV CELLS

(71) Applicant: Commissariat A L'Energie Atomique Et Aux Energies Alternatives, Paris (FR)

(72) Inventors: Mathieu Senghor, Chambery (FR); Solenn Berson, Chambery (FR); Matthieu Manceau, Annecy (FR)

(73) Assignee: Commissariat A L'Energie Atomique Et Aux Energies Alternatives, Paris (FR)

( * ) Notice: Subject to any disclaimer, the term of this patent is extended or adjusted under 35 U.S.C. 154(b) by 0 days. days.

(21) Appl. No.: 15/384,359

(22) Filed: Dec. 20, 2016

(65) Prior Publication Data

US 2017/0104170 A1    Apr. 13, 2017

Related U.S. Application Data

(62) Division of application No. 14/107,296, filed on Dec. 16, 2013.

(30) Foreign Application Priority Data

Jan. 31, 2013    (FR) ..................... 13 50838

(51) Int. Cl.
  *H01B 1/00*    (2006.01)
  *C09D 5/24*    (2006.01)
  (Continued)

(52) U.S. Cl.
  CPC ............ *H01L 51/4293* (2013.01); *B05D 5/12* (2013.01); *C08G 61/126* (2013.01); *C09D 5/24* (2013.01);
  (Continued)

(58) Field of Classification Search
  CPC . H01B 1/00; H01B 1/127; H01B 1/20; C09D 5/24; H01L 51/00; H01L 51/42; C08G 61/00; C08G 61/12
  See application file for complete search history.

(56) References Cited

U.S. PATENT DOCUMENTS

2006/0187617 A1 *   8/2006   Toida .................... H01G 9/028
                                                      361/523
2008/0248313 A1    10/2008   Seshadri et al.
(Continued)

FOREIGN PATENT DOCUMENTS

GB           2 433 646 A     6/2007
WO       2008/073149 A2     6/2008

OTHER PUBLICATIONS

Yangping Wen et al., "A Novel Electrochemical Biosensing Platform Based on Poly(3,4-ethylenedioxythiophene):poly(styrenesulfonate) Composites," Synthetic Metals, vol. 162, No. 13, Mar. 12, 2012, pp. 1308-1314.
(Continued)

Primary Examiner — Mark Kopec
(74) Attorney, Agent, or Firm — Burr & Brown, PLLC

(57) ABSTRACT

An optoelectronic device having a layer comprising: poly (3,4-ethylenedioxythiophene); polystyrene sulfonate; and a compound (A) having formula:

$$-\!\!\left[Ar_1\right]_x\!\!-\!\!\left[Ar_2\right]_y\!\!-$$
with $SO_3H$ substituent wherein $0<x/y<1$, Ar1 and Ar2 represent aromatic rings, which may be identical or different, and at least one Ar1 and Ar2 comprises at least one hydrophobic substituent on its ring.

18 Claims, 2 Drawing Sheets

| Upper electrode | — 2 |
|---|---|
| P layer | — 3 |
| Active Layer | — 4 |
| N Layer | — 5 |
| Conductive Oxide | — 6 |
| Substrate | — 1 |

(51) Int. Cl.
  *H01L 51/00*   (2006.01)
  *H01L 51/42*   (2006.01)
  *B05D 5/12*    (2006.01)
  *H01B 1/12*    (2006.01)
  *C08G 61/12*   (2006.01)
  *C09D 165/00*  (2006.01)
  *C08K 3/04*    (2006.01)
  *C08L 65/00*   (2006.01)

(52) U.S. Cl.
  CPC .......... *C09D 165/00* (2013.01); *H01B 1/127* (2013.01); *H01L 51/0005* (2013.01); *H01L 51/0036* (2013.01); *H01L 51/0037* (2013.01); *H01L 51/0043* (2013.01); *C08G 2261/124* (2013.01); *C08G 2261/1412* (2013.01); *C08G 2261/1424* (2013.01); *C08G 2261/1452* (2013.01); *C08G 2261/3223* (2013.01); *C08G 2261/512* (2013.01); *C08G 2261/91* (2013.01); *C08K 3/04* (2013.01); *C08K 3/045* (2017.05); *C08L 65/00* (2013.01); *C08L 2205/02* (2013.01); *H01L 51/42* (2013.01); *Y02E 10/549* (2013.01)

(56) References Cited

U.S. PATENT DOCUMENTS

| | | |
|---|---|---|
| 2009/0230361 A1 | 9/2009 | Seshadri et al. |
| 2011/0042665 A1 | 2/2011 | Uetani |
| 2011/0108825 A1 | 5/2011 | Uetani |
| 2011/0248223 A1* | 10/2011 | Zheng ............ C09D 5/24 252/519.21 |
| 2012/0097898 A1 | 4/2012 | Seshadri et al. |
| 2012/0161080 A1 | 6/2012 | Jin et al. |
| 2014/0008747 A1 | 1/2014 | Uetani |
| 2014/0211374 A1* | 7/2014 | Sugihara ............ C08L 65/00 361/527 |

OTHER PUBLICATIONS

Monika M. Voigt et al., "*Gravure Printing for Three Subsequent Solar Cell Layers of Inverted Structures on Flexible Substrates*," Solar Energy Materials & Solar Cells, vol. 95, 2011, pp. 731-734.

Jonas Weickert et al., "*Spray-Deposited PEDOT:PSS for Inverted Organic Solar Cells*," Solar Energy Materials & Solar Cells, vol. 94, 2010, pp. 2371-2374.

Matthew T. Lloyd et al., "*Influence of the Hole-Transport Layer on the Initial Behavior and Lifetime of Inverted Organic Photovoltaics*," Solar Energy Materials & Solar Cells, vol. 95, 2011, pp. 1382-1388.

French Search Report (Application No. 1350838) dated Jun. 19, 2013.

* cited by examiner

| | |
|---|---|
| Upper electrode | — 2 |
| P layer | — 3 |
| Active Layer | — 4 |
| N Layer | — 5 |
| Conductive Oxide | — 6 |
| Substrate | — 1 |
Figure 1
A/
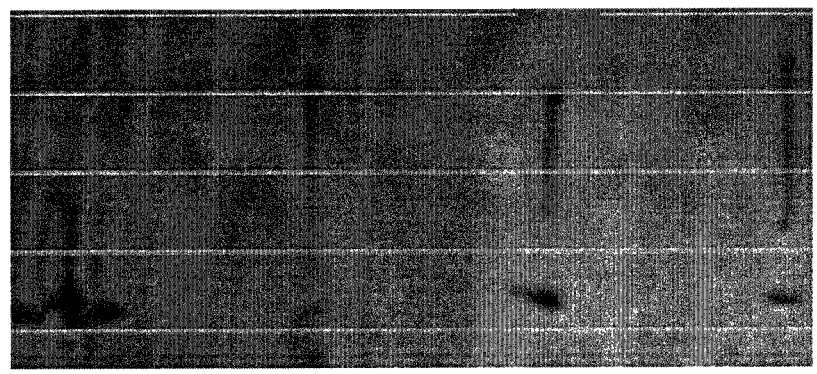
B/
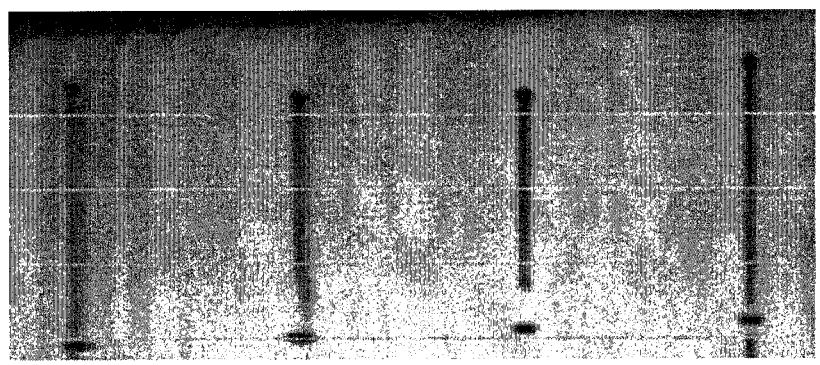
Figure 2

A/

B/

FORMING OF OPTOELECTRONIC DEVICES, PARTICULARLY OF INVERTED-TYPE OPV CELLS

CROSS REFERENCE TO RELATED APPLICATION

This application is a division of U.S. application Ser. No. 14/107,296, filed Dec. 16, 2013, now U.S. Pat. No. 9,559,304, the entirety of which is incorporated herein by reference.

BACKGROUND OF THE INVENTION

1. Field of the Invention

The present invention falls within the framework of the search for technical solutions easing the forming of optoelectronic devices, particularly of "inverted"-type organic photovoltaic (OPV) cells.

More specifically, the invention provides adding an electrically-conductive or semiconductor additive to a formulation or dispersion containing PEDOT (poly(3,4-ethylenedioxythiophene) and PSS (polystyrene sulfonate) used, in particular, to form the HTL ("Hole Transport Layer") of OPV cells. The presence of such an additive is intended to modify the wetting ability of the formulation towards the surface of a hydrophobic layer. The formulation can then easily be deposited in the form of a layer directly on a hydrophobic layer, such as an active layer made of hydrophobic semiconductor material present in inverted OPV cells. Such a deposition can then be performed by conventional techniques such as inkjet printing.

This solution can find applications for OPV cells as well as for any other optoelectronic device such as photodetectors (OPDs, "Organic Photo Detectors"), OLEDs ("Organic Light Emitting Diodes"), or PLEDs ("Polymer Light Emitting Diodes").

2. Description of Related Art

Organic photovoltaic (OPV) cells are devices capable of converting solar energy into electric energy by using organic semiconductor materials, to create a photovoltaic effect. Active materials, as well as the architectures of such devices, are still evolving to meet performance and lifetime criteria enabling to widen the field of application of such technologies. The methods for manufacturing such devices also remain a constant concern.

In a conventional OPV cell structure, a substrate 1 is covered with the following successive layers:

an electrically-conductive layer 2 containing a conductive oxide used as a first electrode;

a semiconductor hole transport layer 3, also called HTL or also P layer;

an active layer 4 made of organic semiconductor material;

a semiconductor electron transport layer 5, also called ETL or also N layer; and a conductive layer 6 used as a second electrode.

In an inverted structure, also called NIP structure, such as schematically shown in FIG. 1, the stack has the following sequence:

substrate 1;

a conductive layer 6 containing a conductive oxide used as a first electrode;

an n (or N) semiconductor layer 5;

an active layer 4;

a p (or P) semiconductor layer 3;

a conductive layer 2 used as a second electrode or upper electrode.

One of the main advantages of the OPV technology is the possibility to entirely form the devices by a wet process, via a varied range of printing and/or coating methods: inkjet, silk screening, slot-die, photogravure, spray coating, spin coating, flexography, or doctor blade coating . . . .

To date, the so-called "inverted" structure of OPV cells appears as the most promising since it enables to achieve the longest lifetimes. In such a configuration, the P layer, which is the hole transport layer or HTL, is thus arranged at the surface of the active layer.

Currently, the hole transport layer is generally obtained from a formulation or dispersion containing PEDOT:PSS. It comprises:

Poly(3,4-EthyleneDiOxyThiophene) or PEDOT having the following chemical structure:

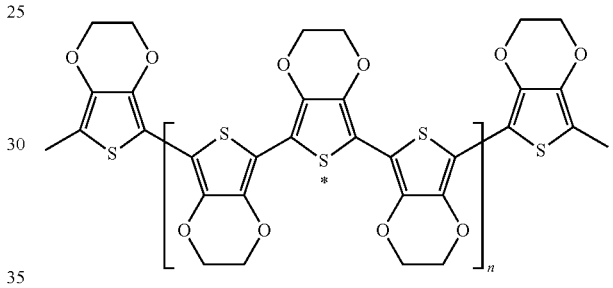

n being a positive integer.

PolyStyrene Sulfonate or PSS in proton form (right-hand side) or not (left-hand side), having the following chemical structure:

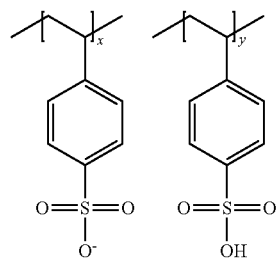

x and y being positive integers.

PSS being a water-soluble polymer, most PEDOT:PSS formulations contain water.

Now, in OPV cells, the active layer onto which the formulation containing PEDOT:PSS is intended to be deposited is strongly hydrophobic and thus has a poor wettability by aqueous solutions.

Accordingly, the wetting ability or the ability of the PEDOT:PSS suspension to spread on the active layer is generally poor. It is thus difficult to perform continuous and uniform depositions without carrying out surface treatments.

An alternative to such treatments is to adapt the formulation intended to form the hole transport layer in order to improve its ability to wet the hydrophobic active layer.

Thus, and as an example, different solutions have been envisaged to solve this problem of compatibility between the active layer and the P layer containing PEDOT:PSS:

Document Voigt et al. (*Solar Energy Materials and Solar Cells*, 95, 2011, 731-734) describes the adding of a solvent (isopropanol) and/or of a non-ionic and non-conductive fluorosurfactant (Zonyl® FS300) to a PEDOT:PSS formulation to arrange it on the active layer by photogravure. However, the OPV cells thus obtained have a relatively low performance and a plasma treatment of the surface remains necessary.

Document Weickert et al. (*Solar Energy Materials and Solar Cells*, 95, 2010, 2371-2374) discloses the dilution of the formulation in a large quantity of alcohol (2-propanol) and the performing of a deposition by spray-coating on the active layer. However, the dry matter content being very low after dilution, the layer has a small final thickness. In relation with the specific spray-coating technique, it is possible to compensate for this small thickness by repeating the operations, but this is not feasible for most deposition techniques. Further, such a technique appears to be incompatible with the subsequent printing of an electrode, the article reporting the evaporation of the electrode.

Another option has been provided in document Lloyd et al. (*Solar Energy Materials and Solar Cells*, 95, 2011, 1382-1388). It comprises carrying out a plasma treatment on the active layer to make it more hydrophilic. However, such a treatment creates defects and degrades the layer.

There thus appears to be an obvious need to identify new technical solutions improving the forming of a hole transport layer containing PEDOT:PSS on the hydrophobic active layer of an optoelectronic device, and more generally of a layer containing PEDOT:PSS on a hydrophobic support.

SUMMARY OF THE INVENTION

Thus, and within the framework of the present invention, new compounds of surface-active type have been identified, to be integrated in formulations or dispersions containing PEDOT:PSS, especially used to form the hole transport layer of OPV cells, which simultaneously enable:

to increase their wetting ability towards a hydrophobic layer, particularly at the surface of the active layer of OPV cells;

not to lower the electric conductivity of the layer thus formed;

to make this layer compatible with the printing of an electrode at its surface, in the context of OPV cells.

According to a first aspect, the present invention relates to a composition comprising:
poly(3,4-ethylenedioxythiophene) or PEDOT;
polystyrene sulfonate or PSS;
a compound (A) having formula:

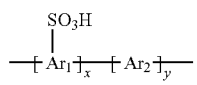

with $0 < x/y < 1$;
Ar1 and Ar2 representing aromatic rings, which may be identical or different;
Ar1 and/or Ar2 comprising at least one hydrophobic substituent on its ring.

It should be noted that polystyrene sulfonate or PSS may be in proton form ($SO_3H$) or not ($SO_3^-$), or in the 2 forms.

The compound (A) is thus intended to behave as a surface-active agent in such a composition. It is further advantageously electrically conductive or electrically semi-conductor.

Due to its structure, it is a conjugate copolymer having a pattern substituted with a sulfonic group. Further, at least one pattern of the copolymer is substituted with hydrophobic lateral chains.

Suitably and advantageously, aromatic ring Ar2 supports no conductive ionic group, and in particular no sulfonic group.

Compound (A) advantageously has an aromatic ring (Ar1 and/or Ar2) selected from the group comprising: thiophene; bithiophene; terthiophene; thienothiophene; pyrrole; carbazole; diketopyrrolopyrrole (DPP); selenophene; cyclopentadithiophene (CPDT); dithieno cyclopentadithiophene; Si-cyclopentadithiophene (Si-CPDT); dithieno Si-cyclopentadithiophene; fluorene; dithienofluorene; benzene; benzothiazole; benzothiadiazole; dithienobenzothiadiazole; quinoxaline; thiazole; phosphole, advantageously thiophene.

According to a preferred embodiment, the two aromatic rings (Ar1 and Ar2) are identical, and advantageously are thiophenes.

Further, and preferably, the hydrophobic substituent is an ether chain (—O—R) supported by one of the carbon atoms of the aromatic ring. R may be a linear or branched chain, comprising carbon atoms (advantageously from 1 to 15) and possible heteroatoms, such as O or N (advantageously from 1 to 10). Advantageously, R comprises at least one ether bond (R'—O—R"). More advantageously still, the substituent has the following formula:

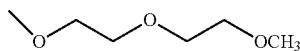

Advantageously, such a hydrophobic substituent is at least supported by aromatic ring Ar2. According to a specific embodiment, both Ar1 and Ar2 comprise at least one hydrophobic substituent, Ar1 and Ar2 being likely to support an identical hydrophobic substituent.

According to a specific embodiment, the compound (A) has the following formula:

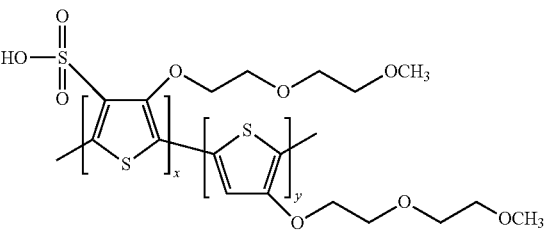

The compound (A) corresponds to poly(3-[2-(2-methoxyethoxy)]thiophene-2,5-diyl-co-3-[2-(2-methoxyethoxy)]-4-sulfonic-thiophene-2,5-diyl). It is a copolymer having both a hydrophilic character due to the sulfonic groups ($SO_3H$) and a hydrophobic character due to the ether chains. Such groups are placed on thiophene groups, the chaining of which enables to provide a good conductivity.

It should be noted that the compound is a so-called "p-type" conjugate copolymer, conventionally used as the only component of the HTL of the OPV cells. It has a good ability to wet the active layer of OPV cells but, due to its high solubility, it is not compatible with inks containing silver, used to form the upper electrode of the OPV cells. Thus, devices integrating this material as an HTL and a printed silver electrode are systematically short-circuited.

A composition according to the invention may correspond to an ink. Thus, and more generally, it may, in addition to the dispersion containing PEDOT:PSS and to compound A, comprise at least one solvent, advantageously selected from the group comprising: water; propan-2-ol; 2-Butoxyethanol (or ethylene glycol monobutyl ether, EGMBE); ethanol; butan-1-ol; butan-2-ol; ethylene glycol; propylene glycol; diethylene glycol; dowanol DPM; ethylene glycol methyl ether.

According to a specific embodiment, the composition according to the invention comprises a mixture of propan-2-ol and of 2-butoxyethanol, and possibly of water. More specifically, it may contain:

water, advantageously in a proportion by volume smaller than 5%, more advantageously still smaller than 2%, and optimally equal to 0%;

propan-2-ol, advantageously in a proportion by volume greater than 30%, more advantageously still between 40 and 60%, and optimally between 50 and 55%;

2-butoxyethanol, advantageously in a proportion by volume between 10% and 50%, and more advantageously still between 15 and 35%.

Further, and in practice, the dispersion containing PEDOT:PSS, intended to be mixed with compound A and possibly with one or a plurality of the above-mentioned solvents, may further comprise one or a plurality of additives selected from the group comprising:

a solvent of high boiling point, such as N-Methyl-2-pyrrolidone;

a solvent such as isopropanol;

a crosslinking agent such as gamma-glycidoxypropyltrimethoxysilane (Silquest A187™ commercialized by Momentive Performance Materials Inc);

a surfactant agent such as an additive containing acetylenic diol, for example, Dynl™604 commercialized by Air Product.

Advantageously, the compound (A) amounts to from 0.01 to 0.2% by weight of the composition according to the invention, more advantageously still from 0.05 to 0.2% by weight, and particularly amounts to 0.1% by weight or more.

According to another aspect, the present invention relates to a method for preparing a composition according to the invention comprising mixing the compound (A) in a dispersion containing PEDOT:PSS, possibly in the presence of one or a plurality of solvents as defined hereafter and by the mentioned advantageous proportions.

In the context of the invention, such a composition is particularly intended to provide a layer, after deposition on a substrate. For example, and as already mentioned, the composition according to the invention may be an ink intended to be deposited on a substrate, advantageously on the active layer of an optoelectronic device, in particular by means of the inkjet printing technique. After deposition and drying causing the evaporation of the solvent(s) of the composition, the obtained layer, advantageously the hole transport layer of an optoelectronic device, is made of the polymers present in the composition according to the invention, in particular PEDOT, PSS, and the compound (A).

Thus, and according to another aspect, the present invention relates to an optoelectronic device having a layer comprising:

poly(3,4-ethylenedioxythiophene) or PEDOT;

polystyrene sulfonate or PSS;

a compound (A) such as defined hereabove.

As already mentioned, such an optoelectronic device may be an organic photovoltaic (OPV) cell, advantageously in inverted configuration, but also an OPD ("Organic Photo Detector"), an OLED ("Organic Light Emitting Diode"), or a PLED ("Polymer Light Emitting Diode").

Advantageously, the compound (A) amounts to from 1% to 30% by dry weight of said layer, advantageously from 25 to 30%.

Such a layer is advantageously arranged at the surface of the active layer of the optoelectronic device. Thus, such a layer is particularly advantageous as a hole transport layer, deposited on the active layer of an optoelectronic device such as a photovoltaic device, advantageously of an organic photovoltaic cell in inverted configuration (NIP).

Conventionally, an active layer of an optoelectronic device, advantageously photovoltaic, combines an electron donor and an electron acceptor. Thus, and according to a specific embodiment, the active layer is made of:

P3HT (poly(3-hexylthiophene-2,5-diyl) or poly(3-hexylthiophene)) as an electron donor, having formula:

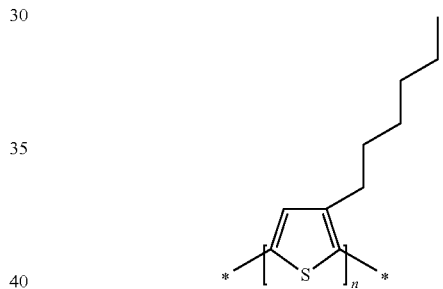

n being a positive integer;

PCBM or PC$_{60}$BM (methyl [6,6]-phenyl-C$_{61}$ butyrate) as an electron acceptor, having formula:

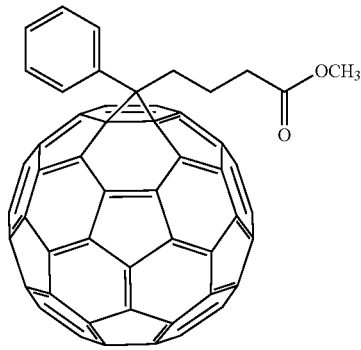

As a variation, the electron donor polymer may be selected from the group comprising:

poly[[9-(1-octylnonyl)-9H-carbazole-2,7-diyl]-2,5-thiophenediyl-2,1,3-benzo-thiadiazole-4,7-diyl-2,5-thiophenediyl] or PCDTBT:

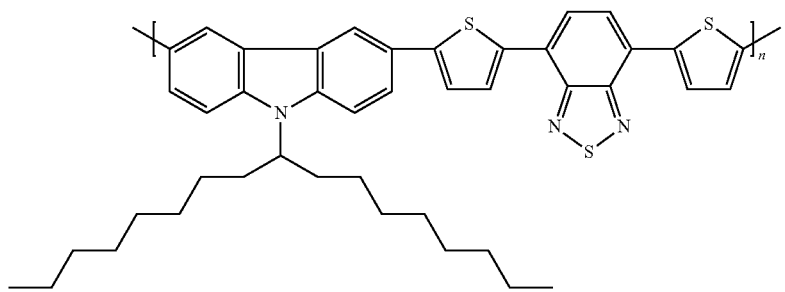
poly[2,1,3-benzothiadiazole-4,7-diyl[4,4-bis(2-ethyl-hexyl)-4H-cyclopenta[2,1-b:3,4-b']dithiophene-2,6-diyl]] or PCPDTBT:
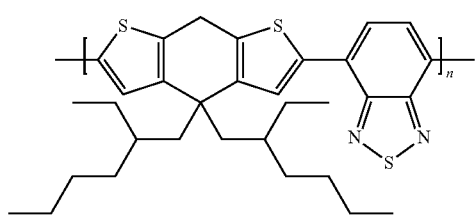
PBDTTPD:
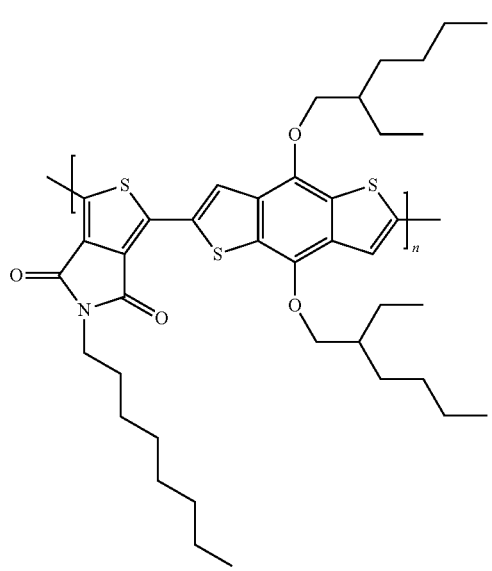
PTB7:
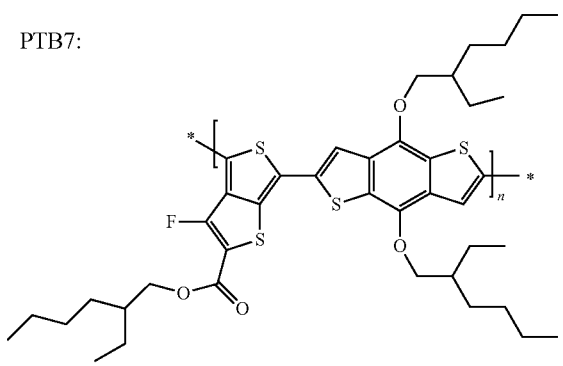
Similarly, the electron acceptor may be another fullerene selected from the group comprising:
$PC_{70}BM$ ([6,6]-Phenyl C71 butyric acid methyl ester):
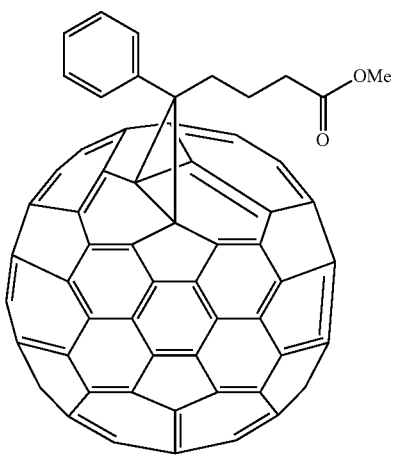
$IC_{60}BA$ (1',1",4',4"-tetrahydro-di[1,4]methanonaphtha-leno[5,6] fullerene-$C_{60}$):
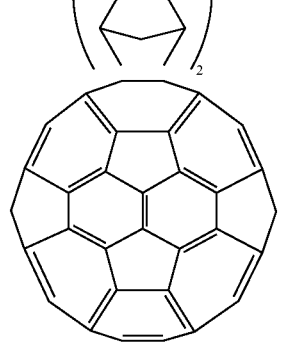
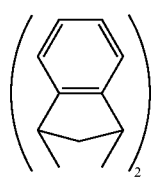

bis-PC$_{60}$BM Bis(1-[3-(methoxycarbonyl)propyl]-1-phenyl)-[6.6]C$_{62}$):

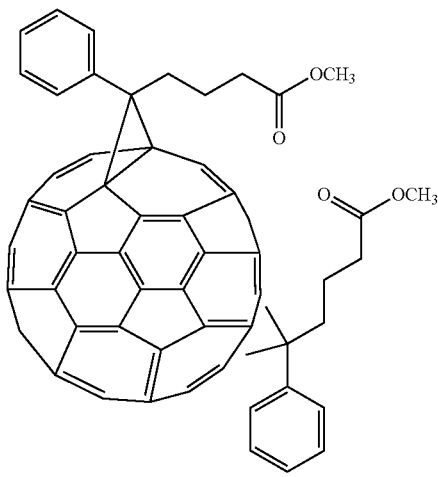

An HTL according to the invention has the advantageous feature of being compatible with the printing, at its surface, of an electrode. Thus, and according to another aspect, the optoelectronic device, advantageously photovoltaic, according to the invention comprises a printed electrode at the surface of the HTL. Conventionally, it is made of silver (Ag). It may also be made of copper, aluminum, graphite, or even of a mixture of these materials.

More specifically in relation with a photovoltaic cell in inverted configuration, it further comprises:

a substrate, advantageously a plastic substrate, for example, made of PET (polyethylene terephtalate), of PEN (polyethylene naphtalate) or of polycarbonates;

a conductive oxide layer used as an electrode, advantageously formed by means of a TCO ("Transparent Conductive Oxide"), for example, ITO (for "Indium Tin Oxide" or "tin-doped indium oxide"), GZO ("Gallium-doped Zinc Oxide"), AZO (containing aluminum), YZO (containing Yttrium), IZO (containing indium), or FTO (SnO$_2$:F);

an N layer, typically a semiconductor metal oxide, possibly doped, such as zinc oxide (ZnO) possibly doped with aluminum (Al), with indium (In), or with gallium (Ga), or titanium dioxide (TiO$_2$) possibly doped with manganese (Mn).

It should be noted that, according to the invention, the method of forming an optoelectronic device, in particular a photovoltaic layer in inverted configuration, may be entirely implemented by wet processes, only by means of simple deposition techniques, which are easily implemented in an industrial use. Thus, and as an example, the N layer and the active layer may be deposited by spin-coating while the HTL and the upper electrode are deposited by inkjet printing.

Thus, the present invention provides a method for forming an optoelectronic device, advantageously of a photovoltaic cell in inverted configuration (NIP), comprising the deposition on a layer having a composition such as described hereabove, advantageously to form the HTL on the active layer. Preferably, the deposition is performed by inkjet printing.

It should be noted that the addition of the compound (A) in the formulation intended to provide the HTL enables to achieve uniform homogeneous depositions on the active layer, whereby it can be done away with any surface treatment.

Further, the HTL thus obtained is compatible with the printing of the upper electrode. Thus, and according to a specific aspect, said forming method comprises the subsequent deposition, advantageously by inkjet printing, of the upper electrode, for example, made of silver, at the surface of the HTL.

More generally, the present invention relates to the use of a compound (A) such as defined hereabove to increase the ability of a composition comprising PEDOT:PSS to wet a hydrophobic layer, in particular at the surface of the active layer made of semiconductor material of an optoelectronic device such as a photovoltaic cell of inverted structure (NIP). In other words, and in this context, the compound (A) of surface-active type is used as a wetting agent.

The advantages of the present invention will better appear from the following embodiments.

BRIEF DESCRIPTION OF THE DRAWINGS

FIG. 1 shows a diagram of organic PV cells in a so-called inverted or NIP structure.

FIG. 2 illustrates the quality of ejection of the drops at a temperature T=30° C. of a PEDOT:PSS formulation with no additive (A) and of a composition according to the invention (B).

DETAILED DESCRIPTION OF THE INVENTION

Examples of Embodiment

Figure 3:
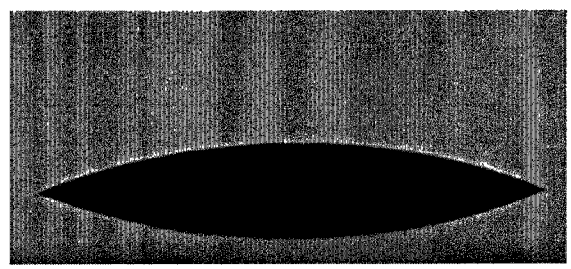
FIG. 3 illustrates the contact angle, on the active layer, of a PEDOT:PSS formulation with no additive (A) and of a composition according to the invention (B).
Figure 3:
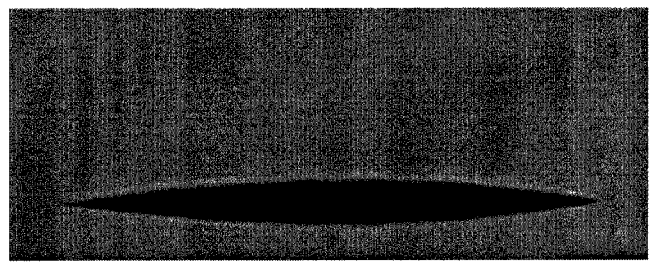

The following non-limiting embodiments, in relation with the accompanying drawings, aim at illustrating the invention.

1. Additive Selection:

The specific additive used in the context of the examples of embodiment has the following chemical formula:

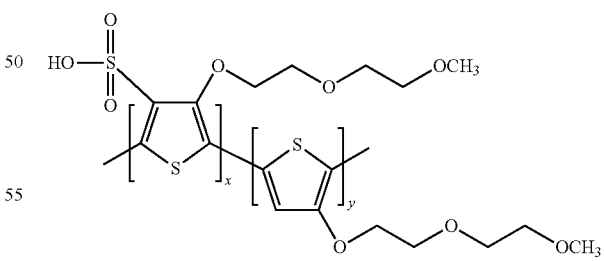

with 0<x/y<1.

It is a copolymer having both a hydrophilic character due to the sulfonic groups (SO$_3$H) and a hydrophobic character due to the ether chains. Such groups are positioned on thiophene groups, the chaining of which enables to provide a good conductivity. It is poly(3-[2-(2-methoxyethoxy)] thiophene-2,5-diyl-co-3-[2-(2-methoxyethoxy)]-4-sulfonic-thiophene-2,5-diyl).

2. Ink Formulation:
a. Commercial PEDOT:PSS Solutions
The effect of the additive has been tested with two PEDOT:PSS formulations commercialized by Heraeus:
 CPP 105D
 F010
The main physicochemical properties of these formulations are listed in Table 1 hereafter:

|  | Dry matter content (%) | Viscosity at 700 s$^{-1}$ (cP) | pH | Work function (eV) |
|---|---|---|---|---|
| CPP105D | ~1 | 30 | 2.8 | 4.8 |
| F010 | ~1 | 30-60 | 2.8 | 4.8 | b. Solvents
To optimize the ink properties (ejection, spreading, drying) and the final deposition thickness, the following solvents have been added to the mixture of the additive in the dispersion containing PEDOT:PSS:
 Propan-2-ol (IPA);
 2-Butoxyethanol (or ethylene glycol monobutyl ether, EGMBE).
c. Compositions of the Formulations Used and of the Obtained Dry Films
The composition of the two developed formulations is given in Table 2 hereafter, the quantities being given in proportion by volume.

|  | PEDOT:PSS formulation quantity (%) | Plexcore HTL quantity | IPA quantity | EGMBE quantity (%) |
|---|---|---|---|---|
| Ink 1 | 16 | 1 | 50 | 33 |
| Ink 2 | 25 | 5 | 55 | 15 |

Plexcore HTL: commercial solution comprising the additive;
IPA (solvent) = isopropanol or propan-2-ol;
EGMBE (solvent) = ethylene glycol monobutyl ether.

The inks are prepared from the commercial dispersion of PEDOT:PSS (CPP 105D or F010), to which is added the commercial Plexcore HTL solution containing the additive, as well as isopropanol, EGMBE, and possibly water.
The quantity of added plexcore HTL is such that the quantity of additive in the final ink is in the range from 0.01% and 0.2% by weight. Preferably, it is at least 0.1% by weight.
Preparation of Ink 1:
To prepare 10 mL of ink 1, it is started by sampling 1.6 mL of the commercial PEDOT:PSS formulation, to which is added 0.1 mL of the commercial formulation of plexcore HTL containing the additive, and then 5 mL of isopropanol, and finally 3.3 mL of EGMBE.
Preparation of Ink 2:
To prepare 10 mL of ink 2, it is started by sampling 2.5 mL of the commercial PEDOT:PSS formulation, to which is added 0.5 mL of the commercial formulation of plexcore HTL containing the additive, and then 5.5 mL of isopropanol, and finally 1.5 mL of EGMBE.
The solutions thus prepared are then stirred at ambient temperature and atmosphere for one night before their use.
The quantity of additive in inks 1 and 2 is respectively 0.02% and 0.1% by weight.
The proportions of PEDOT:PSS and of additive within the dry films (after ink printing and drying) and thus such as present within the final device, are also given in Table 3 hereafter, the values corresponding to mass proportions:

|  | PEDOT:PSS (%) | Additive (%) |
|---|---|---|
| Dry film Ink 1 | 87.5 | 12.5 |
| Dry film Ink 2 | 71.5 | 28.5 |

3. Impact on the Droplet Ejection Capability:
The ink droplet ejection capability has been tested by means of a material printer of FujiFilm Dimatix DMP 2800 type, with a droplet ejection at 30° C. and while applying a 30-V voltage.
Ink 1 has been tested and compared with the suspension containing PEDOT:PSS.
As illustrated in FIG. 2, adding the additive enables to improve the droplet ejection capability, and particularly to increase the droplet ejection stability.
4. Impact on the Contact Angle:
Above-described inks 1 and 2 (with an additive) as well as equivalent inks with no additive (corresponding to the dispersion containing PEDOT:PSS) have been tested.
The tests have been carried out on samples having a structure similar to that of OPV devices, that is:
Substrate/Conductive Oxide/N Layer/Active Layer
The N layer is formed by thermal conversion of a derivative of zinc acetate, previously deposited by spin-coating. Its final thickness is approximately 20 nm. The active layer is made of a mixture of poly(3-hexylthiophene) (P3HT) and of ([6,6]-phenyl-C$_{61}$-methyl butyrate) (PCBM). Its dry thickness is 200 nm and the P3HT:PCBM mass ratio is 1:0.6. It is deposited by spin-coating from a solution in ortho-dichlorobenzene under an inert atmosphere.
The contact angle measurements have been made in ambient conditions of temperature (~25° C.) and humidity (~35%), in static mode, by means of a Krüss EasyDrop DSA20 device controlled by software Drop Shape Analysis II.
Each value of Table 4 hereafter corresponds to the average of 9 measurements.

|  | Formulations | Contact Angle (°) |
|---|---|---|
| Ink 1 | With Additive | 30.5 +/− 1.6 |
|  | Without Additive | 15.2 +/− 0.9 |
| Ink 2 | With Additive | 40.5 +/− 3.0 |
|  | Without Additive | 23.2 +/− 1.5 |

As appears from this table and from FIG. 3, the presence of the additive in the formulations enables to improve their ability to spread on the active layer of the devices. A marked decrease of the in the presence of the additive can indeed by observed for the two formulations according to the invention.
5. Impact on the Conductivity of the Dry Film:
For these measurements, deposits having a thickness of approximately 100 nm have been prepared by spin-coating on glass substrates. The samples have then been annealed on a hot plate for 10 minutes at 120° C. under an inert atmosphere.
As indicated in Table 5 hereafter, the presence of the additive by the tested proportions does not significantly modify the electric conductivity of the dry film:

| Formulations | | Sheet resistance (Ω/sq.) |
|---|---|---|
| Ink 1 | With Additive | 850 +/− 15 |
| | Without Additive | 857 +/− 14 |
| Ink 2 | With Additive | 549 +/− 12 |
| | Without Additive | 541 +/− 17 |

6. Performance of the Devices According to the Invention:

The tests have been carried out on NIP-type devices, having the following structure:
PET Substrate (1)/Conductive oxide (6)/N Layer (5)/Active Layer (4)/P Layer (3)/Silver upper electrode (2)
with: N Layer (5)=Zinc Oxide (ZnO);
Active Layer (4)=poly(3-hexylthiophene)/methyl [6,6]-phenyl-$C_{61}$-butyrate (P3HT/PCBM)

The first two layers (N layer and active layer) have been formed by spin-coating while the P layer (3) and the silver electrode (2) have been formed by inkjet printing. The active surface area of the devices was 1.8 cm$^2$ and their performance has been measured at 25° C. in standard lighting conditions (1,000 W/m$^2$, AM 1.5 G).

Table 6 hereafter discloses the performance of the devices according to the tested formulations:

| Formulation | Efficiency |
|---|---|
| Ink 1 | 1.20% |
| Ink 2 | 2.10% |

Inks 1 and 2 may be applied by inkjet while being compatible with a printed electrode.

As appears from the foregoing, the present invention advocates the addition of a well-identified electrically-conductive or semiconductor additive, having the advantages of:
enabling to achieve uniform and homogeneous depositions of the HTL on the active layer, without requiring any surface treatment,
having a satisfactory performance in OPV cells;
being compatible with a printed electrode.

More generally, the present invention provides a technical solution to formulate compositions containing PEDOT:PSS improving their ability to wet hydrophobic surfaces. Thus, the present invention can be used for all devices where a layer containing PEDOT:PSS is to be deposited on a hydrophobic layer, in particular on the active layer made of hydrophobic material of an optoelectronic device, such as OLEDs and PLEDs.

The invention claimed is:

1. An optoelectronic device having a layer comprising:
poly(3,4-ethylenedioxythiophene);
polystyrene sulfonate; and
a compound (A) having formula:

$$\mathrm{-[Ar_1]_x-[Ar_2]_y-}$$

with SO$_3$H substituent, wherein
0<x/y<1,
Ar1 and Ar2 represent aromatic rings, which may be identical or different, and
at least one Ar1 and Ar2 comprises at least one hydrophobic substituent on its ring, and
wherein the compound (A) is present in an amount of from 1% to 30% by dry weight of said layer.

2. The optoelectronic device of claim 1, wherein the compound (A) amounts to from 25% to 30% by dry weight of said layer.

3. The optoelectronic device of claim 1, wherein said layer is arranged at a surface of an active layer of the optoelectronic device.

4. The optoelectronic device of claim 1, wherein the compound (A) is electrically conductive or electrically semiconductive.

5. The optoelectronic device of claim 1, wherein each aromatic ring (Ar1, Ar2) is selected from the group consisting of thiophene, bithiophene, terthiophene, thienothiophene, pyrrole, carbazole, diketopyrrolopyrrole, selenophene, cyclopentadithiophene, dithieno cyclopentadithiophene, Si-cyclopentadithiophene, dithieno Si-cyclopentadithiophene, fluorene, dithienofluorene, benzene, benzothiazole, benzothiadiazole, dithienobenzothiadiazole, quinoxaline, thiazole, and phosphole.

6. The optoelectronic device of claim 5, wherein aromatic rings Ar1 and Ar2 are thiophenes.

7. The optoelectronic device of claim 1, wherein the hydrophobic substituent is an ether chain (—O—R), where R may be a linear or branched chain, comprising carbon atoms.

8. The optoelectronic device of claim 7, wherein the carbon atoms number from 1 to 15.

9. The optoelectronic device of claim 7, wherein R comprises heteroatoms.

10. The optoelectronic device of claim 9, wherein the heteroatoms are O or N.

11. The optoelectronic device of claim 9, wherein the heteroatoms number from 1 to 10.

12. The optoelectronic device of claim 7, wherein at least one of Ar1 and Ar2 comprises a hydrophobic substituent having the following structure:

—O—CH$_2$CH$_2$—O—CH$_2$CH$_2$—OCH$_3$.

13. The optoelectronic device of claim 7, wherein Ar1 and Ar2 comprise a hydrophobic substituent having the following structure:

—O—CH$_2$CH$_2$—O—CH$_2$CH$_2$—OCH$_3$.

14. The optoelectronic device of claim 1, wherein the compound (A) has the following formula:

[structure showing a thiophene copolymer with HO—S(=O)$_2$— group, —O—CH$_2$CH$_2$—O—CH$_2$CH$_2$—OCH$_3$ substituents, and repeat units x and y]

15. A photovoltaic cell in inverted configuration (NIP) having a layer comprising:
poly(3,4-ethylenedioxythiophene);
polystyrene sulfonate; and
a compound (A) having formula:

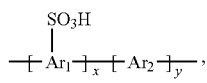

wherein
$0 < x/y < 1$,
Ar1 and Ar2 represent aromatic rings, which may be identical or different, and
Ar1 and/or Ar2 comprises at least one hydrophobic substituent on its ring, and
wherein the compound (A) is present in an amount from 1% to 30% by dry weight of said layer.

16. The photovoltaic cell in inverted configuration of claim 15, wherein said layer is arranged at a surface of an active layer of the optoelectronic device.

17. The photovoltaic cell in inverted configuration of claim 15, wherein each aromatic ring (Ar1, Ar2) is selected from the group consisting of thiophene, bithiophene, terthiophene, thienothiophene, pyrrole, carbazole, diketopyrrolopyrrole, selenophene, cyclopentadithiophene, dithieno cyclopentadithiophene, Si-cyclopentadithiophene, dithieno Si-cyclopentadithiophene, fluorene, dithienofluorene, benzene, benzothiazole, benzothiadiazole, dithienobenzothiadiazole, quinoxaline, thiazole, and phosphole.

18. The photovoltaic cell in inverted configuration of claim 15, wherein the compound (A) has the following formula:

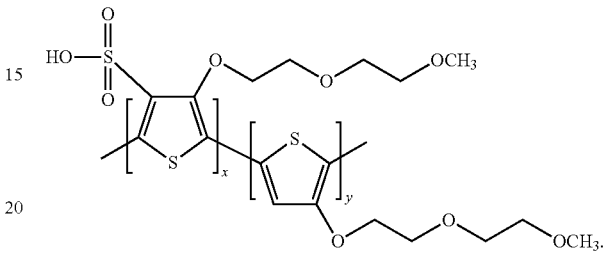

* * * * *